United States Patent [19]

Gardner et al.

[11] Patent Number: 5,165,986
[45] Date of Patent: Nov. 24, 1992

[54] COPPER CONDUCTIVE COMPOSITION FOR USE ON ALUMINUM NITRIDE SUBSTRATE

[75] Inventors: Robert D. Gardner, Northfield; Kathleen M. Rhoads, Seville; Raymond F. Babuder, Fairview Park, all of Ohio

[73] Assignee: Ferro Corporation, Cleveland, Ohio

[21] Appl. No.: 710,559

[22] Filed: Jun. 5, 1991

[51] Int. Cl.$^5$ .............................................. B32B 9/00
[52] U.S. Cl. .................................. 428/209; 428/457; 428/688; 428/901; 174/250; 361/397
[58] Field of Search .......................... 501/19, 32, 457; 252/512, 514; 361/397; 428/209, 688, 698, 901; 174/250

[56] References Cited

U.S. PATENT DOCUMENTS

| | | | |
|---|---|---|---|
| 4,251,397 | 2/1981 | Scheiber | 252/521 |
| 4,293,451 | 10/1981 | Ross | 252/514 |
| 4,400,214 | 8/1983 | Ogawa et al. | 106/1.13 |
| 4,406,701 | 9/1983 | Yamaoka et al. | 252/512 |
| 4,476,039 | 10/1984 | Hormadaly | 252/518 |
| 4,540,673 | 9/1985 | Takeda et al. | 501/96 |
| 4,880,567 | 11/1989 | Prabhu et al. | 252/512 |

FOREIGN PATENT DOCUMENTS

| | | |
|---|---|---|
| 0132810 | 2/1985 | European Pat. Off. . |
| 0153737 | 9/1985 | European Pat. Off. . |
| 1251766 | 10/1971 | United Kingdom . |

OTHER PUBLICATIONS

"Thermodynamic Considerations In The Thick-Film Metallization Of Aluminum Nitride Substrates", by M. G. Norton, Journal of Materials Science Letters 9 (1990) 91-93.

Primary Examiner—Patrick J. Ryan
Assistant Examiner—W. Krynski
Attorney, Agent, or Firm—Renner, Otto, Boisselle & Sklar

[57] ABSTRACT

Aluminum nitride (AlN), due to its high thermal conductivity, is an attractive substrate material to the power hybrid market, (i.e., users employing circuits utilizing power semiconductors resulting in a great deal of heat being produced by the electronic device). In spite of its attractive thermal, mechanical and dielectric properties, AlN substrates generally afford certain drawbacks, the primary drawback being that many conductive compositions do not readily adhere to the surface. One of the more desirable conductors to utilize in conductive compositions when producing microcircuits is copper. In accordance with the present invention, a copper containing conductive composition is provided which affords excellent adhesion to AlN substrates. The conductive composition preferably comprises copper or a copper alloy, a glass binder, and cadmium oxide.

6 Claims, No Drawings

COPPER CONDUCTIVE COMPOSITION FOR USE ON ALUMINUM NITRIDE SUBSTRATE

TECHNICAL FIELD OF THE INVENTION

This invention relates to conductive compositions useful for the preparation of high-thermal conductivity circuit substrates. More particularly, a copper conductive composition has been developed having high quality and stability. The composition will resist blistering when applied to an aluminum nitride (AlN) ceramic substrate and fired in a nitrogen atmosphere.

BACKGROUND OF THE INVENTION

A variety of metal-containing compositions (i.e., pastes, inks, tapes, etc.) useful in forming resistors, dielectrics and conductors which are employed in hybrid-micro electronic components have been developed in the field of electronics. Generally, such compositions, and particularly a paste or an ink composition, include a conductor (e.g., copper, aluminum, gold, silver, platinum, tin, and the like as well as alloys of each of these different metals), resistive or dielectric components, a binder, (e.g., a glass or inorganic oxides), and a carrier comprising generally a solvent with a resin and a thixotrope and/or a wetting agent.

The above-described paste or ink compositions are applied in the desired configuration or pattern onto a suitable substrate to form the desired circuit for use as a microelectronic component. There have been a number of substrate materials developed for use in these applications. For example, such substrate materials may include alumina ($Al_2O_3$), beryllia (BeO), aluminum nitride (AlN) and silicon carbide (SiC).

Until recently, most circuit substrates have been made of ceramic substrates such as alumina ($Al_2O_3$) or a resin substrate. In some applications, $Al_2O_3$ substrates have superior mechanical strength and electrical insulation properties. Additionally, such substrates can be easily made into green sheets, which are utilized in the production of high-density multilayer hybrid circuits. Thus, $Al_2O_3$ has found wide or extensive use. However, the thermal conductivity of $Al_2O_3$ is low, only about 20 W/mK.

In recent years, as electronic devices have become smaller, the packaging density of electronic devices (such as IC's) mounted on a circuit substrate has increased. In addition, power semiconductors are being used. Consequently, a great deal of heat is produced by the electronic devices, making it necessary for the circuit substrate to radiate heat away efficiently. However, since the thermal conductivity of $Al_2O_3$ is low, when a great deal of heat is produced, it is impossible to expect much of it to be radiated away from the circuit substrate. Consequently, when mounting electronic devices in a high-density packaging configuration or producing modules containing power semiconductors, it is desirable to have a circuit substrate which has high thermal conductivity in addition to mechanical strength and good electrical insulation.

In recent years, progress has been made in fine ceramics technology. For example, ceramic materials such as silicon carbide and aluminum nitride have been developed which exhibit superior mechanical strength and thermal conductivity. While much research has been conducted with silicon carbide, this material has a high dielectric constant and low dielectric strength and, in turn, presents serious problems in using it for high-frequency circuit devices and for devices to which high voltage will be applied.

Aluminum nitride on the other hand exhibits good electric insulation as well as thermal conductivity and thus has been found promising for application as circuit substrates. This material has thermal conductivity in the range of at least about 100 W/mK, mechanical strength of about 40 to 50 $Kg/mm^2$ and a dielectric strength of about 140 to 170 kV/cm. Thus, aluminum nitride, due to its high thermal conductivity, is an attractive substrate material to the power hybrid market. However, because its surface is not an oxide, or contains very little $Al_2O_3$, conductive compositions designed for alumina have nothing to react with and thus a somewhat weak bond is generally formed. Also, there can be a problem of blister formation during the processing of most circuit substrates of this nature. Specifically, when the glass binder used in conductive compositions begins to react or flood over the aluminum nitride, nitrogen gas is liberated causing blisters to be created in the film, thus lifting the film off of the substrate.

Of the possible metals that may be used as conductors in these conductive compositions, copper (Cu) is considered optimal for a number of reasons. Copper offers the signal speed of silver while avoiding the problems of the leaching or migrating of silver or other noble metals. However, a copper conductive composition for use on ceramic substrates comprised of aluminum nitride has not yet been developed.

Aluminum nitride substrates for use in microelectronic devices has been described in the art, for example, Norton, in the *Journal of Material Science Letters*, 9 (1990) 91-93, describes a lithium-based paste composition which is screen printable on alum nitride substrates and is thermodynamically stable.

U.S. Pat. No. 4,540,673 describes semi-conductor devices using a sintered aluminum nitride having high thermal conductivity and containing at least one other metal compound selected from beryllium (Be), lithium (Li) and compounds of these metals.

United Kingdom Patent specification 1,251,766 discloses a noble metal metallizing composition that may be applied to glass substrates and fired to produce a conductive metallic coating.

U.S. Pat. No. 4,400,214 discloses a conductive paste comprising particulate copper, aluminum (Al), and at least one of zinc (Zn) a nd silver (Ag) for use in making conductors for microcircuit conductors. More specifically, alloy powders useful for making up a conductive paste to be applied to the appropriate substrate are disclosed.

A stain-resistant ruthenium oxide based resistor composition is disclosed in U.S. Pat. No. 4,476,039. The ruthenium oxide based compound containing composition is useful as a stain-free printable thick film resistor composition for microcircuit applications.

U.S. Pat. No. 4,251,397 discloses vehicles useful for thick film resistors that are fireable in nonoxidizing atmospheres. Specifically, it is disclosed that film paste based on compositions where the vehicle or carrier is based on copolymers of ethylene and vinyl acetate have high viscosity, good printability and exhibit no carbonaceous residue upon firing.

Glass binder compositions for thick film paste compositions are disclosed in European Patent application 0 132 810. It is disclosed that a borosilicate glass composition free of bismuth, cadmium and lead is especially useful as a binder for thick film resistor compositions and also such a binder serves to adjust the TCR of resistors made therefrom.

European Patent application 0 153 737 discloses a high thermal conductivity circuit substrate that comprises sintered aluminum nitride ceramic which further consists essentially of at least one member selected from the group of yttrium, the rare earth metals and the alkali earth metals and an electrically conductive thick film paste applicable for forming a conductive layer on the substrate.

None of the foregoing references suggest or describe a copper conductor composition which is applicable for aluminum nitride ceramic substrates. Moreover, none of the foregoing references suggest or describe a microelectronic circuit substrate having a copper conductive composition fired on an aluminum nitride substrate.

SUMMARY OF THE INVENTION

In general, the present invention provides a pioneering development for circuit substrates exhibiting highly desirable electrical characteristics such as high electrical resistivity, high dielectric strength, excellent mechanical strength and additionally, superior thermal conductivity.

In accordance with present invention, a conductive composition is provided for application to a high thermal conductivity circuit substrate that results in a stable, highly adhesive, blister resistent conductive layer on such substrate.

Still further in accordance with the present invention, a high thermal conductivity circuit substrate having an electrically conductive path or layer formed from an electrically conductive composition fired on an aluminum nitride ceramic substrate is provided.

Still further in accordance with the present invention, an aluminum nitride circuit substrate is provided onto which a copper conductive layer is bonded.

Still further in accordance with the present invention, a conductive composition comprising copper, or a copper alloy metal conductor, a glass binder and cadmium oxide is provided which is highly adherent to an aluminum nitride substrate with substantially no blistering upon firing. The composition displays an initial adhesion of at least 3.5 lbs and a resistivity in the range of about 0.1 to about 3.0 m$\Omega$/□/mil.

Still further in accordance with the present invention, a process is provided for producing a stable, high thermal conductivity circuit substrate, exhibiting excellent mechanical strength and high dielectric strength by applying to a ceramic substrate a conductive composition comprising copper, or a copper alloy, a glass binder, cadmium oxide, and optionally a carrier, and heating the substrate to which the paste composition was applied in a nonoxidizing atmosphere at less than about 900° C.

The term "circuit substrate" as used herein this specification and the claims below is intended to include all substrates containing wiring or a conductive path or pattern such as a circuit substrate for mounting components, IC chip packages, IC chip carriers.

These and other aspects of the present invention will become clear to those skilled in the art upon the reading and understanding of the specification and the claims below.

DETAILED DESCRIPTION OF THE PREFERRED EMBODIMENTS

The invention provides a new and useful conductive composition having high performance which is adapted for application upon aluminum nitride substrates and forming conductive paths or patterns upon such substrates. The conductive composition displays high bond strength or adhesion as well as excellent mechanical strength, superior thermal conductivity and high dielectric strength. The conductive composition comprises:

I) copper or a copper alloy,
II) a binding effective amount of a glass binder, and
III) cadmium or an oxide of cadmium.

Preferably, component III comprises cadmium oxide (CdO) from a trace amount up to about 10 percent by weight based on the combined weight of components I, II and III. As used in this specification and the claims below the term "trace amount" means at least about 0.005 weight percent.

Applicants' unique composition will adhere to aluminum nitride and furthermore the composition can be fired at less than about 900° C. in an inert or nonoxidizing atmosphere.

As mentioned above, it is highly desirable to employ copper in conductive compositions because copper does not have the leaching or migration problems of some of the noble metals such as silver and yet it offers the signal speed of silver. However, copper must be fired in inert or nonoxidizing atmosphere, for example, a nitrogen atmosphere. While pure copper is preferred for the purposes of the present invention, the present invention also contemplates that copper alloys may also be employed within the scope of the present invention. For example, the alloy may be comprised of copper and a metal or metals selected from the group comprising aluminum, silver, gold, zinc, tin, platinum and mixtures thereof.

For circuit substrates derived from aluminum nitride ceramic substrates, it has been found that the bondability of the glass layer to the aluminum nitride substrate is very important to the utility of a circuit substrate. In the case of sealing, for example, where a cap must be joined to a substrate, sealing with glass may be employed. Similarly, where a bond must be formed between a lead frame and a lead substrate, glass bonding may be employed. Further, in the case of printed multilayer packages wherein a dielectric layer is necessary for interlayer insulation, a glass layer may be utilized as the dielectric layer.

The glass binders which may be used in the practice of the present invention may be generally selected from those used on alumina substrates. For example, glasses of $PbO-B_2O_3-SiO_2$ and similar systems may be used and are preferred. In consideration of the influence of the glass layer on the AlN substrate, for example, a change in the oxidation state of the AlN substrate, a glass having a softening point of about 350° C. to about 850° C. may be applied at a temperature of from about 400° C. to about 900° C. Of course, it will be appreciated that the specific firing temperature which is required will be a function of the glass composition which is utilized.

Applicants have found it to be beneficial to include cadmium (Cd), and specifically cadmium oxide (CdO) as a component of the composition. Preferably, the CdO comprises from about a trace amount to about 10 percent by weight of the solids of the composition (the solids of the composition including the copper, the CdO and the glass binder). Applicants believe that the cadmium (Cd) promotes adhesion between the composition and the AlN substrate.

It is advantageous for these compositions to also include a carrier or vehicle for applying the composition to the substrate. While green tape carriers are contemplated to be within the scope of the present invention, a liquid carrier for forming a paste is preferred. The liquid carrier will generally comprise an organic solvent, a resin, and optionally a thixotropic agent and/or a wetting agent. The main purpose of the carrier is to serve as a vehicle for dispersion of the finely divided solids of the conductive composition in such form that it can readily be applied to a ceramic or other substrate. Thus, the carrier must first of all be one in which the solids are dispersible with an adequate degree of stability. Secondly, the rheological properties of the carrier must be such that they lend good application properties to the dispersion.

Most conductive compositions such as, for example, inks and pastes, are applied to a substrate by means of screen printing. Therefore they must have appropriate viscosity so that they can be passed through the screen readily. In addition, they should be thixotropic in order that they set up rapidly after being screened in order to give good resolution. While the rheological properties are of primary importance, the carrier is preferably formulated also to give appropriate wettability of the solids and the substrate, good drying rate, dried film strength sufficient to withstand rough handling and good firing properties. Satisfactory appearance of the fired composition is also important.

In view of all of the foregoing criteria, a wide variety of inert liquids may be used in the carrier. The carrier for most conductive compositions is typically a solution of a resin dissolved in a solvent and, frequently, a solvent solution containing both resin and a thixotropic agent. The solvent usually boils within the range of 130°–350° C.

The most frequently used resin for this purpose is ethyl cellulose. However, resins such as ethyl hydroxy ethyl cellulose, wood rosin, mixtures of ethyl cellulose and phenolic resins, polymethacrylates of lower alcohols and monobutyl ether of ethylene glycol monoacetate can also be used.

The most widely used solvents for thick film applications are terpenes such as alpha- or beta-terpineol or mixtures thereof with other solvents such as kerosene, dibutyl phthalate, butyl carbitol, butyl carbitol acetate, hexylene glycol and high-boiling alcohols and alcohol esters. Various combinations of these and other solvents formulated to obtain the desired viscosity and volatility requirements for each application.

Among the thixotropic agents which are commonly used are organic based thixotropics such as, for example, hydrogenated castor oil and derivatives thereof and ethyl cellulose. It is of course, not always necessary to incorporate a thixotropic agent since the solvent/resin properties coupled with the sheer thinning inherent in any suspension may alone be suitable in this regard. Furthermore, a wetting agent may be employed such as fatty acid esters, e.g., N-tallow-1,3-diaminopropane di-oleate, N-tallow trimethylene diamine diacetate, N-coco trimethylene diamine, beta diamines, N-oleyl trimethylene diamine, N-tallow trimethylene diamine, and/or N-tallow trimethylene diamine dioleate.

The ratio of carrier to solids in the conductive compositions may vary considerably and is dependent upon the manner in which the conductive compositions are to be applied and the type of carrier used. Normally to achieve good coverage, the conductive composition will contain complementally by weight 60–90% solids and 40–10% carrier (liquids). Such conductive compositions are usually of semi-fluid consistency and are referred to commonly as "pastes".

For the purposes of the present invention, it is found that the copper paste preferably contains from about 80% to about 85% by weight solids and from about 15 to about 20% by weight of the carrier (liquids). Furthermore, it has been discovered that the preferred range of solids for the paste composition according to the present invention is as follows:

a) copper/copper alloy from about 80 to about 98 percent by weight of the solids;
b) glass binder from about 1 to about 10 percent by weight of the solids; and
cadmium oxide from about 1 to about 10 percent by weight of the solids.

With respect to the carrier, it is found that the preferable composition according to the present invention is as follows:

1) at least about 90 percent by weight organic solvent;
2) up to about 15 percent by weight resin;
3) up to about 4 percent by weight thixotropic agent; and
4) up to about 2 percent by weight wetting agent.

It should be kept in mind that the foregoing compositional ranges are preferred and it is not the intention to be limited to these ranges where one of ordinary skill in the art would recognize that these ranges may vary dependent upon specific applications, specific components and conditions for processing and forming the end products.

The paste according to the present invention may be conveniently prepared on a three-roll mill. The amount and type of carrier utilized is determined mainly by the final desired formulation viscosity and thickness. In preparing compositions according to the present invention, the particulate inorganic solids are mixed with the carrier and dispersed with suitable equipment, such as a three-roll mill, to form a suspension, resulting in a composition for which the viscosity will be in the range of about 100 to about 450 poise at a sheer rate of 9.6 sec$^{-1}$ as determined on a CARRI-MED viscometer. The CARRI-MED is utilized at a 2 cm diameter setting, 1° cone at 25° C.

The circuit substrates according to the present invention are preferably produced by applying a conductive composition of the present invention to an aluminum nitride ceramic substrate, usually by the process of screen printing, to a desired wet thickness, e.g., from about 15 to about 40 micrcns. Preferably, automatic screen printing techniques are employed using a 200–325 mesh screen. The printed pattern is then dried at below 200° C., e.g., preferably at about 120° C. for about 5–15 minutes before firing. Firing to effect sintering of both the inorganic binder and the finely divided particles of metal is done in a controlled, non-oxidizing atmosphere belt conveyor furnace having a temperature profile that will allow burnout of the organic matter at about 300° C. to about 600° C., a period of maximum temperature of about 800° C. to about 900° C. lasting about 5–15 minutes, followed by a controlled cool-down cycle to prevent over sintering, unwanted chemical reactions at intermediate temperatures or substrate fracture which can occur from too rapid cool down. A controlled atmosphere is intended to mean a non-oxidizing atmosphere such as nitrogen, argon or mixtures thereof. For the purposes of the present invention a nitrogen atmosphere is preferred. The overall firing procedure will preferably extend over a period of about 30 minutes, with about 8 to 12 minutes to reach the firing temperature, about 5 to 10 minutes at the firing temperature, and about 8 to 12 minutes in cool down. In some instances, total cycle times as long as 60 minutes may be used, with about 20 to 25 minutes to reach firing temperature, about 10 minutes at the firing temperature, and about 20 to 25 minutes in cool down.

As a result of the paste or conductive composition according to the present invention, a pattern of electrically conductive paths or layers of copper having adequate bond strength for practical purposes may be formed on an AlN substrate in accordance with the process procedures described above. Consequently, the resulting AlN substrate has much higher thermal conductivity than other substrates such as alumina and also has superior dielectric strength, so it is suitable for circuit substrates which generate a great deal of heat, such as power semiconductor packages or high density packages.

In addition, since electrically conductive paths or layers can be formed with pastes, such pastes can be used for finely detailed circuit patterns. More importantly such pastes may be used to form detailed circuit patterns from copper which alleviate problems associated with the noble metals and also do not display the problems of blistering or the production of an inferior bond.

The following examples will serve to illustrate the novel features and advantages of the present invention. While these examples will show one skilled in the art how to operate within the scope of this invention, they are not to serve as a limitation on the scope of the invention for such scope is only defined in the claims below.

EXAMPLE I

The components listed in Table 1 were weighed in accordance with the prescribed mixing ratio into the total amount of a 25 g batch formulation. The solids were dispersed into the liquid carrier by using a three roll mill.

TABLE 1

| Materials Used | Trade Name/Lot# | Source | Wt. % | Grams |
|---|---|---|---|---|
| (a) Copper Paste Formulation-25 gram batch[4] | | | | |
| [1]Copper | CuII/#90628 | Grezes Inc. P.O. Box 205 Berwyn, PA | | 19.73 |
| [1]Glass $PbO-B_2O_3-SiO_2$ | RW 5809C | Ferro Corporation 1000 Lakeside Cleveland, OH 44114 | 2.16% solids | 0.4 |
| [1]Cadmium Oxide | CdO/#2030 KAVY | Mallinckrodt Inc. Paris, KY | 5.0% solids | 1.06 |
| [2,3]Organic solvent | Texanol (solvent) | Eastman Chemical Div. P.O. Box 431 Kingsport, TN | | 3.733[2] |
| [2,3]Resin | Elvacite 2045 | Dupont Methacrylate Products Wilmington, DE 19898 | | |
| [2,3]Resin | Acryloid B-67 | Rohm & Haas Philadelphia, PA 19105 | | |
| [3]Thixotrope | Y-40 Xylol/ #88C063 | United Catalysts P. O. Box 32370 Louisville, KY | 0.25% liquids | 0.009 |
| [3]Wetting agent N-Tallow-1,3-diaminopropane di-oleate | Duomeen TDO | Armak Chemicals 300 S. Wacker Dr. Chicago, IL | 0.2% liquids | 0.008 |
| (b) Aluminum Nitride Substrate | | | | |
| AlN | Ceratronics #900425-B | Norton Company 112 Turnpike Road Suite 303 Westboro, MA 01581 | | |

[1]Solids (i.e., copper, glass and cadmium oxide) total 21.25 grams - thus the composition is about 85 weight percent solids.
[2]A mixture formed from the solvent and resins comprising about 10 percent by weight Acryloid B-67, about 10 percent by weight Elvacite 2045, and about 80 percent by weight Texanol.
[3]Liquids or carrier (i.e., organic solvent, thixotrope and wetting agent) totals 3.75 grams - thus the composition comprises about 15 weight percent liquids.
[4]The paste displayed a viscosity of about 370 poise at 9.65 sec$^{-1}$ as determined on a CARRI-MED viscometer at a 2 cm diameter, 1° cone at 25° C.

EXAMPLE II

A paste formulation was prepared from the components listed in Table 2 according to the procedure of Example I.

TABLE 2

| Materials Used | Trade Name/Lot# | Source | Wt. % | Grams |
|---|---|---|---|---|
| (a) Copper Paste Formulation-25 gram batch[4] | | | | |
| [1]Copper | CuII/#90628 | Grezes Inc. P.O. Box 205 Berwyn, PA | | 18.57 |
| [1]Glass $PbO-B_2O_3-SiO_2$ | RW 5809C | Ferro Corporation 1000 Lakeside Cleveland, OH 44114 | 2.15% solids | 0.43 |

TABLE 2-continued

| Materials Used | Trade Name/Lot# | Source | Wt. % | Grams |
|---|---|---|---|---|
| [1]Cadmium Oxide | CdO/#2030 KAVY | Mallinckrodt Inc. Paris, KY | 5.0% solids | 1.00 |
| [2,3]Organic solvent | Texanol (solvent) | Eastman Chemical Div. P.O. Box 431 Kingsport, TN | | 5.00[2] |
| [2,3]Resin | Elvacite 2045 (Resin) | Dupont Methacrylate Products Wilmington, DE 19898 | | |
| [2,3]Resin | Acryloid B-67 (Resin) | Rohm & Haas Philadelphia, PA 19105 | 100.0% liquids | |
| (b) Aluminum Nitride Substrate | | | | |
| AlN | Ceratronics #900425-B | Norton Company 112 Turnpike Road Suite 303 Westboro, MA 01581 | | |

[1]Solids (i.e., copper, glass and cadmium oxide) total 20.0 grams - thus the composition is about 80 weight percent solids.
[2]Vehicle comprises about 10 percent by weight Acryloid B-67, about 10 percent by weight Elvacite 2045 and about 80 percent by weight Texanol.
[3]Liquids (i.e., vehicle) totals 5.00 grams - thus the composition is about 20 weight percent liquids.
[4]The paste displayed a viscosity of about 200 poise at 9.65 sec$^{-1}$ as determined on a CARRI-MED viscometer at a 2 cm diameter, 1° cone at 25° C.

EXAMPLE III

The paste formulations of Examples I and II were used to form electrically conductive paths on an AlN substrate (samples), and the bond strengths were measured. The results are summarized in Table 3 below.

The samples were prepared as follows. Specifically, two 1"×1", as received, aluminum nitride substrates are rinsed in isopropyl alcohol and dried for 10 minutes at 120° C. A conductor test pattern utilizing the paste of Example I and the paste of Example II is screen printed on the aluminum nitride substrates using a stainless steel, 0.5 mil emulsion, 325 mesh screen. After leveling for 10 minutes, and drying for 10 minutes at 120° C., the samples are fired in a 6 zone Watkins and Johnson furnace in a nitrogen atmosphere using a 22 minute end-to-end profile generating a peak of 850° C. for 5 minutes. Table 4 below illustrates the firing profiles for samples prepared utilizing the conductive paste compositions of Example I.

Wire leads (20 gauge) are attached to the copper pads of the test pattern using a Sn 62 solder at a temperature of 220° C. and a mildly activated rosin soldering flux. After soldering, the flux is removed by immersing the sample in a 50/50 mixture of acetone and 1,1,1-Trichloroethane. Adhesion tests are run using the Instron Series IX Automated Materials Testing System.

TABLE 3

| Test | Formulation of Example I | Formulation of Example II |
|---|---|---|
| Normalized R mΩ/☐/mil | 1.13 | 1.58 |
| Solderability | | |
| w/o burnish | excellent | good |
| w/ burnish | excellent | good |
| Initial Adhesion | 5.154 lbs. | 3.691 lbs. |
| Aged Adhesion (48 hours at 1150° C.) | 3.027 lbs. | less than 3.0 lbs. |

TABLE 4

| Profile | 850° C.F.F.[1] | 850° C.S.P.[2] | 900° C.L.P.[3] |
|---|---|---|---|
| Normalized Resistance (mΩ/☐/mil) | 1.58 | 1.93 | 1.25 |
| Initial Adhesion (lbs. on 80 × 80 mil pads) | 5.94 | 2.72 | 2.38 |

[1]F.F. - fast fire, N5 min. @ peak, N22 min. cycle to end
[2]S.P. - short profile, N10 min. @ peak, N45 min. cycle to end
[3]L.P - long profile, N10 min. @ peak, N57 min. cycle to end Samples prepared utilizing the conductive paste of Example I were subjected to a 1000 hour aged adhesion test. The samples displayed the following as shown in Table 5.

TABLE 5

| Time (hrs) | Force (lbs) |
|---|---|
| 0 | 5.434 |
| 48 | 4.421 |
| 96 | 3.995 |
| 240 | 3.737 |
| 504 | 3.470 |
| 744 | 3.503 |
| 1000 | 3.941 |

Samples prepared utilizing the conductive paste compositions of Example I were also prepared utilizing AlN substrates obtained from various sources. The samples displayed the following properties as shown in Table 6.

TABLE 6

| | Ceratronics | Keramont | Carborundum |
|---|---|---|---|
| $R_N$(mΩ/☐/mil) | 1.15 | 1.18 | 1.18 |
| $A_{Int}$(lbs) | 4.78 | 5.91 | 5.12 |
| $A_{48\ hr.}$(lbs) | 3.63 | 4.43 | 3.87 |
| $A_{100\ hr.}$(lbs) | 3.84 | — | — |

| | Toky. Soda | Anceram100 | Anceram140 |
|---|---|---|---|
| $R_N$(mΩ/☐/mil) | 1.14 | 1.23 | 1.15 |
| $A_{Int}$(lbs) | 5.31 | 4.41 | 6.51 |
| $A_{48\ hr.}$(lbs) | 4.42 | 3.02 | 5.26 |

The majority of the above samples in Table 6 exhibited adhesion failures that pulled out bits of the substrate. All of the samples of Table 6 displayed excellent solder wetting with Sn 62, 220° C., 3 to 5 sec. dip, RMA flux. The adhesion tests were conducted utilizing the DuPont 90° peel test with 80x80 pads. The samples were aged at 150° C. in a noncirculating air dryer.

Additional samples were prepared as described in connection with Example I except the composition of the PbO-SiO$_2$-B$_2$O$_3$ glass binder and the amount of glass binder, copper and CdO was altered. The composition and properties of these pastes are shown below in Tables 7 and 8 respectively.

TABLE 7

|  | A | B | C | D |
|---|---|---|---|---|
| Modified Glass Oxide Compositions (%) | | | | |
| Oxides | | | | |
| PbO | 80 | 70 | 70 | 66 |
| SiO$_2$ | 10 | 20 | 10 | 24 |
| B$_2$O$_3$ | 10 | 10 | 20 | 10 |
| Modified Copper Paste | | | | |
| Grezes II Cu. Powder | 97.5 | 97.0 | 96.0 | 95.0 |
| Modified Glass | 2.0 | 2.0 | 2.0 | 2.0 |
| CdO | 0.5 | 1.0 | 2.0 | 3.0 |

TABLE 8

|  | A | B | C | D |
|---|---|---|---|---|
| Normalized Resistance (mΩ/□/mil) | 1.68 | 1.55 | 1.48 | 1.66 |
| Initial Adhesion (lbs. on 80 × 80 mil pad) | 2.5 | 4.5 | 2.3 | 3.7 |

As illustrated above by the results set out in Tables 3 through 8, the copper conductive compositions of the present invention are found to be effective in forming a strong adhesive bond to aluminum nitride substrates and correspondingly providing a circuit substrate having a copper conductor bonded to an aluminum nitride ceramic substrate. This surprising development will allow the replacement in many applications of aluminum nitride for alumina as a substrate material for use in microcircuit applications and particularly in the power hybrid market where high thermal conductivity is required.

It will be appreciated that although the above examples primarily concern a conductive composition for use in forming a conductor paste for use with aluminum nitride, the present invention also contemplates the use of the principles disclosed herein to form resistor and semiconductor pastes, inks, tapes and the like. Furthermore, such compositions may or may not be considered as materials for use in forming thick films. Thus, applicants' unique conductive composition may be utilized to form conductive, resistive or semiconducting paths or patterns on aluminum nitride. Such conductive composition may assume various forms including an ink, a paste, a tape and the like.

Other features and aspects of this invention will be appreciated by those skilled in the art upon reading and comprehending this disclosure. Such features, aspects and expected variations and modifications of the reported results and examples are clearly within the scope of this invention where the invention is limited solely by the scope of the following claims.

What is claimed is:

1. A high thermal conductivity circuit substrate comprising:
    a) sintered aluminum nitride ceramic substrate; and
    b) a conductive pattern bonded to said substrate; said pattern formed by firing a conductive composition comprising:
        1) copper or copper alloy;
        2) a binding effective amount of a glass binder; and
        3) cadmium (Cd) or an oxide of cadmium;
    wherein said conductive composition has been deposited on the substrate, dried and fired to form said pattern bonded to said substrate.

2. The circuit substrate according to claim 1 wherein said copper alloy comprises copper and a member selected from the group Al, Ag, Au, Zn, Sn, Pt and mixtures thereof.

3. The circuit substrate according to claim 1 said glass binder is PbO-B$_2$O$_3$-SiO$_2$ and said pattern is bonded to said substrate substantially free of blisters.

4. The circuit substrate according to claim 1 wherein the conductive composition comprises a solid and a liquid portion, said solid portion of said conductive composition comprising:
    i) from about 80% to about 98% by weight of component 1);
    ii) from about 1% to about 10% by weight of component 2); and
    iii) from about 1% to about 10% by weight of component 3), said component 3) comprising cadmium oxide (CdO).

5. The circuit substrate according to claim 1 wherein said pattern has an initial adhesion of at least 3.5 lbs.

6. The circuit substrate according to claim 1 wherein said pattern is a thin conductor layer having a resistivity in the range of about 0.1 to about 3.0 mΩ/□/mil.

* * * * *